United States Patent [19]
Okada

[11] Patent Number: 5,798,725
[45] Date of Patent: Aug. 25, 1998

[54] COMPARATOR FOR AN ANALOG TO DIGITAL CONVERTER

[75] Inventor: Kouji Okada, Kasugai, Japan

[73] Assignee: Fujitsu Limited, Kanagawa, Japan

[21] Appl. No.: 743,853

[22] Filed: Nov. 5, 1996

[30] Foreign Application Priority Data

Dec. 28, 1995 [JP] Japan ................... 7-342888

[51] Int. Cl.[6] .................................................. H03M 1/12
[52] U.S. Cl. ............................................................ 341/158
[58] Field of Search .................................. 341/155, 156, 341/158, 159

[56] References Cited

U.S. PATENT DOCUMENTS

| | | | |
|---|---|---|---|
| 4,539,551 | 9/1985 | Fujita et al. | 340/347 |
| 4,893,124 | 1/1990 | Tsuji et al. | 341/156 |
| 5,262,686 | 11/1993 | Kurosawa | 307/362 |
| 5,546,028 | 8/1996 | Yamaguchi | 327/64 |
| 5,570,091 | 10/1996 | Noro et al. | 341/161 |
| 5,583,503 | 12/1996 | Kusakabe | 341/161 |

*Primary Examiner*—Brian K. Young
*Attorney, Agent, or Firm*—Nikaido, Marmelstein, Murray & Oram LLP

[57] ABSTRACT

An improved method and apparatus related to a comparator particularly suited for use in an A/D converter so as to obtain a high resolution, which results in a reduced circuit area and operates with low power consumption. To compare an analog input voltage and reference voltages, the comparator includes chopper type comparators for producing comparison voltages and determination signals, and includes a determination circuit for producing one or more additional determination signals. The chopper type comparators may further include amplifiers and determination circuits.

20 Claims, 7 Drawing Sheets

COMPARATOR FOR AN ANALOG TO DIGITAL CONVERTER

BACKGROUND OF THE INVENTION

1. Field of the Invention

The present invention relates generally to a comparator for comparing an analog input voltage with a reference voltage. More particularly, the invention relates to a comparator suitable for use in an analog/digital converter which converts an analog signal to a digital signal.

2. Description of the Related Art

To improve the operation speed of digital devices such as a microcontroller and provide the digital devices with a multi-function capability, it is necessary to improve the operation speed and the resolution of an analog/digital (A/D) converter which is used for an interface in such a digital device. There are various kinds of A/D converters which include a parallel type (flash type) A/D converter whose conversion speed is relatively higher than those of other types. As shown in FIG. 1, a conventional parallel type A/D converter 10 which outputs a 2-bit digital signal has a reference voltage generator 12, five chopper type comparators 13 to 17, a latch 18 and an encoder 19.

The reference voltage generator 12 includes four resistors R connected in series between a high-potential reference voltage VRH and a low-potential reference voltage VRL. The three nodes between the individual resistors R are respectively connected to the second to fourth comparators 14 to 16, and three divided reference voltages VR1, VR2 and VR3 are respectively output from those three nodes. The second to fourth comparators 14–16 have first input terminals for receiving the respective reference voltages VR1, VR2 and VR3. The first comparator 13 has a first input terminal for receiving the high-potential reference voltage VRH. The fifth comparator 17 has a first input terminal for receiving the low-potential reference voltage VRL. Each of the comparators 13–17 further has a second input terminal for receiving an analog input voltage AIN. The individual comparators 13–17 respectively compare the reference voltages VRH, VR1, VR2, VR3 and VRL with the analog input voltage AIN, and supply determination signals each indicating the comparison result to the latch 18.

Each of the comparators 13–17 includes three analog switches S1, S2 and S3, a capacitor 21 and CMOS inverters 22 and 23. The CMOS inverters 22 and 23 are powered by a high-potential supply of 5 V and a low-potential supply of 0 V. The capacitor 21 has a first electrode (node N1) which is connected via the analog switches S1 and S2 to the first and second input terminals of the associated comparator to receive the associated reference voltage (VRH, VR1–VR3, or VRL) and the analog input voltage AIN, and a second electrode (node N2) connected to the input terminal of the CMOS inverter 22. The analog switches S1 and S2 are set on or off in response to a control signal from a controller (not shown).

The input terminal and the output terminal of the CMOS inverter 22 are connected together via the analog switch S3. This analog switch S3 is set on synchronized with the ON action of the analog switch S2 and is set off synchronized with the OFF action of the analog switch S2. When the analog switch S3 is set on, the input terminal and the output terminal of the CMOS inverter 22 are short-circuited and input and output voltages of these terminals are reset to a threshold voltage Vth. When the analog switch S3 is set off, the CMOS inverter 22 inverts and amplifies the input voltage and supplies an output signal to the CMOS inverter 23. The inverter 23 inverts and amplifies the input voltage and supplies the determination signal to the latch 18. The latch 18 retains the five determination signals supplied from the respective comparators 13–17, and supplies the retained determination signals to the encoder 19. The encoder 19 converts each determination signal to a 2-bit digital signal B0 and B1 and an overflow bit OB.

In each of the comparators 13–17, the analog switch S1 is set off first and the analog switches S2 and S3 are set on. Then, the voltages of the node N2 and the output terminal (node N3) of the CMOS inverter 22 are reset to the threshold voltage Vth. Consequently, the charge current flows through the capacitor 21, making the voltage level at the node N1 equal to the level of the analog input voltage AIN. The voltage at the node N2 becomes Vth—AIN when the voltage at the node N1 is taken as a reference. This switching operation is called a sampling operation. Then, the analog switches S2 and S3 are set off and the analog switch S1 is set on to compare the reference voltage with the analog input voltage AIN. As a result, the voltage level at the node N1 becomes equal to the level of the associated one of the reference voltages VRH, VR1–VR3 and VRL. When a reference voltage VRH, VR1–VR3 or VRL is higher than the analog input voltage AIN, the capacitor 21 causes the voltage at the node N2 to become higher than the threshold voltage Vth of the CMOS inverter 22. As a result, the inverter 22 outputs the L-level output signal. When a reference voltage VRH, VR1–VR3 or VRL is lower than the analog input voltage AIN, the capacitor 21 sets the voltage at the node N2 lower than the threshold voltage Vth of the CMOS inverter 22. Consequently, the inverter 22 outputs the H-level output signal.

To provide the A/D converter 10 with a high resolution, the number of resistors R and the number of comparators should be increased. This results in an increase in the circuit area and an increase in the consumed current. Further, providing the A/D converter 10 with high resolution reduces the potential difference between the reference voltages of adjacent comparators and makes accurate voltage comparison difficult. Accordingly, the conversion precision of the A/D converter 10 drops.

The CMOS inverters 22 and 23 in each of the comparators 13–17 have the consumed current characteristic wherein the maximum consumed current occurs near the input voltage of 2.5 V as shown in FIG. 2. That is, when the potential difference between each reference voltage and the analog input voltage AIN is small, the current flows through the inverters and increases the consumed current. To prevent an increase in the consumed current, an A/D converter 24 has been proposed which outputs a 3-bit digital signal and which includes two reference voltage generators 25 and 29, three amplifiers 26, 27 and 28, nine chopper type comparators 30A to 30I and an encoder 31, as shown in FIG. 3.

The first reference voltage generator 25 has two resistors R1 connected in series between a high-potential reference voltage VRH and a low-potential reference voltage VRL. A divided reference voltage VR0 is output from the node between those two resistors R1. The first amplifier 26 amplifies the high-potential reference voltage VRH to produce a reference voltage V26. The second amplifier 27 amplifies the reference voltage VR0 to produce a reference voltage V27. The third amplifier 28 amplifies the low-potential reference voltage VRL to produce a reference voltage V28. The second reference voltage generator 29 has four resistors R2 connected in series between the output terminals of the first and second amplifiers 26 and 27 and four resistors R3 connected in series between the output terminals of the second and third amplifiers 27 and 28. The second reference voltage generator 29 divides the voltage that is equivalent to the potential difference between the reference voltages V26 and V27 and respectively outputs reference voltages VD1 to VD3 from the three nodes between the individual resistors R2 between the output terminals of the first and second amplifiers 26 and 27. The second reference voltage generator 29 further divides the voltage that is equivalent to the potential difference between the reference voltages V27 and V28 and respectively outputs reference voltages VD4 to VD6 from the three nodes between the individual resistors R3 between the output terminals of the second and third amplifiers 27 and 28.

The individual comparators 30A–30I have non-inverting input terminals for respectively receiving the reference voltages V26, VD1–VD3, V27, VD4–VD6 and V28 and inverting input terminals for receiving the analog input voltage AIN. The comparators 30A–30I compare the reference voltages V26, VD1–VD3, V27, VD4–VD6 and V28 with the analog input voltage AIN respectively and supply determination signals indicating the comparison results to the encoder 31. The encoder 31 converts the nine determination signals into a 3-bit digital signal B0, B1 and B2 and an overflow bit OB.

The first to third amplifiers 26–28 in the A/D converter 24 respectively amplify the reference voltages VRH, VR0 and VRL. The resistors R2 and R3 in the second reference voltage generator 29 divide the amplified reference voltages V26, V27 and V28. This structure increases the potential differences supplied to the comparators 30A–30I to suppress a reduction in conversion precision. However, in order to reduce errors in the values of the amplified voltages, the individual amplifiers 26 to 28 are required to have small offsets or be able to adjust their offset voltages. The use of such amplifiers also undesirably increases the circuit area and the consumed power of the A/D converter 24.

SUMMARY OF THE INVENTION

Broadly speaking, the present invention relates to a comparator having a reduced circuit area that operates with low power consumption. The invention also relates to an A/D converter which has a high resolution.

The present invention can be implemented in numerous ways including as an apparatus and as a method. Several embodiments of the invention are described below.

In one aspect of the invention, an improved comparator includes first and second chopper type comparators for respectively producing comparison voltages between an analog input voltage and first and second reference voltages. Each chopper type comparator then outputs a determination signal based on the comparison voltage it produced. The comparator of the present invention further includes a determination circuit, connected between the first and second chopper type comparators, which produces one or more intermediate comparison voltages and one or more additional determination signals based on those intermediate comparison voltages. The improved comparator of the present invention may further include an amplifier and a determination circuit in each chopper type comparator for respectively producing the comparison voltage and determination signal within each of the chopper type comparators.

As an A/D converter, another aspect of the invention includes a reference voltage generator for producing reference voltages and connected to a comparator used to compare an analog input voltage with the generated reference voltages. The comparator includes two chopper type comparators for respectively producing comparison voltages between first and second reference voltages and the analog input voltage and for producing determination signals based on the comparison voltages. The comparator further includes a determination circuit, connected between the first and second chopper type comparators, which produces one or more intermediate comparison voltages and one or more additional determination signals based on those intermediate comparison voltages. The A/D converter further includes an encoder, connected to the comparator, for receiving the determination signals output by the comparator and converting them to digital signals. The A/D converter of the present invention may further include an amplifier and a determination circuit in each chopper type comparator for respectively producing the comparison voltage and determination signal within each of the chopper type comparators.

As a method of comparing an analog input voltage with reference voltages and producing determination signals indicative of the comparison results, an aspect of the present invention includes the operations of producing a first comparison voltage between the analog input voltage and a first reference voltage using an amplifier in a first chopper type comparator, and producing a first determination signal indicating a first comparison result based upon the first comparison voltage, using a first determination circuit incorporated in the first chopper type comparator. The method further includes producing a second comparison voltage and second determination signal using a second chopper type comparator with an amplifier and determination circuit. In addition the method includes producing at least one intermediate comparison voltage having a voltage between the first and second comparison voltages using a voltage divider connected between the two chopper type comparators, and producing a third determination signal based upon the intermediate comparison voltage using a third determination circuit connect to the voltage divider.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

First Embodiment

Figure 5:
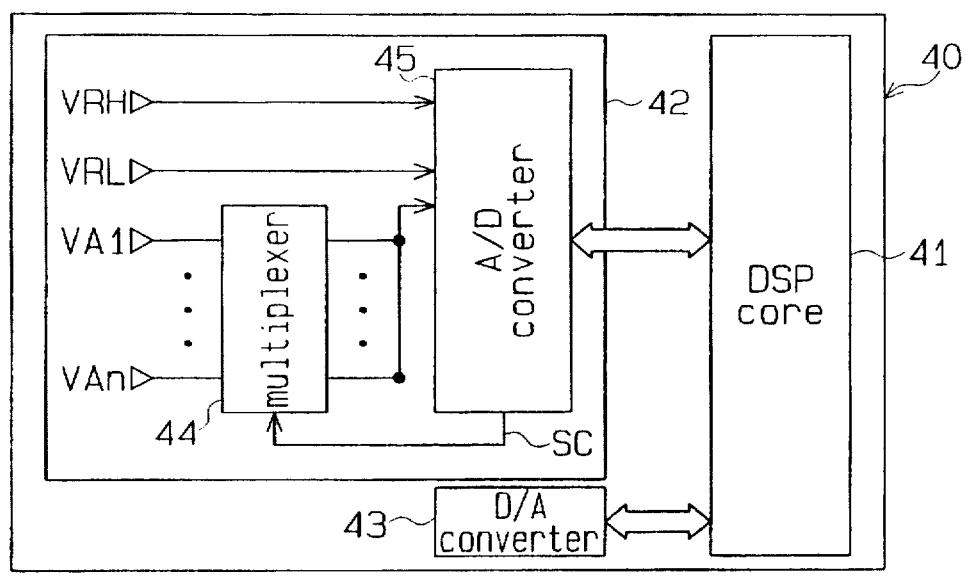
FIG. 5 is a block diagram showing a DSP chip having the A/D converter shown in FIG. 4.

The first embodiment of the present invention will be described below with reference to the accompanying drawings. As shown in FIG. 5, a digital signal processor (DSP) chip 40 as a semiconductor device has a DSP core 41, an A/D conversion circuit unit 42, and a digital/analog (D/A) converter 43. The A/D conversion circuit unit 42 receives an analog input voltage signal supplied from an external device and converts it to a digital signal. The DSP core 41 receives the digital signal from the A/D conversion circuit unit 42 and performs digital signal processing on the digital signal. The DSP core 41 further controls the signal converting operation of the A/D conversion circuit 42 and the D/A converter 43. The D/A converter 43 converts the resulting processed digital signal from the DSP core 41 to an analog signal.

The A/D conversion circuit unit 42 includes a multiplexer 44 and a parallel type (flash type) A/D converter 45. The multiplexer 44 receives n-channel analog input voltages VA1 to VAn (where n is an integer equal to or greater than 2). The multiplexer 44 selects one channel of an analog voltage signal in response to a select signal SC output from the A/D converter 45 and supplies the selected analog voltage signal to the A/D converter 45.

Figure 1:
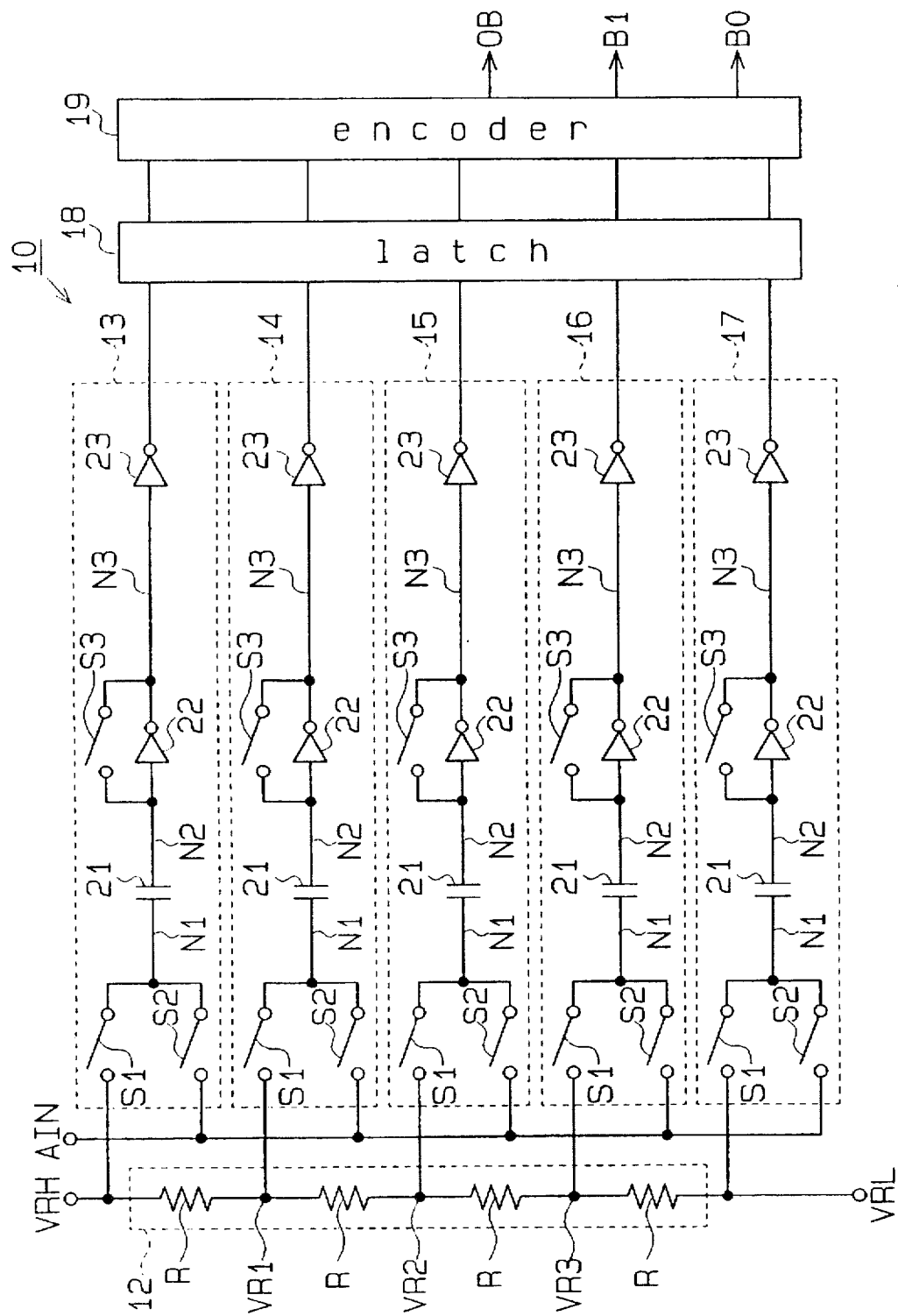
FIG. 1 is a circuit diagram illustrating a conventional A/D converter.
Figure 2:
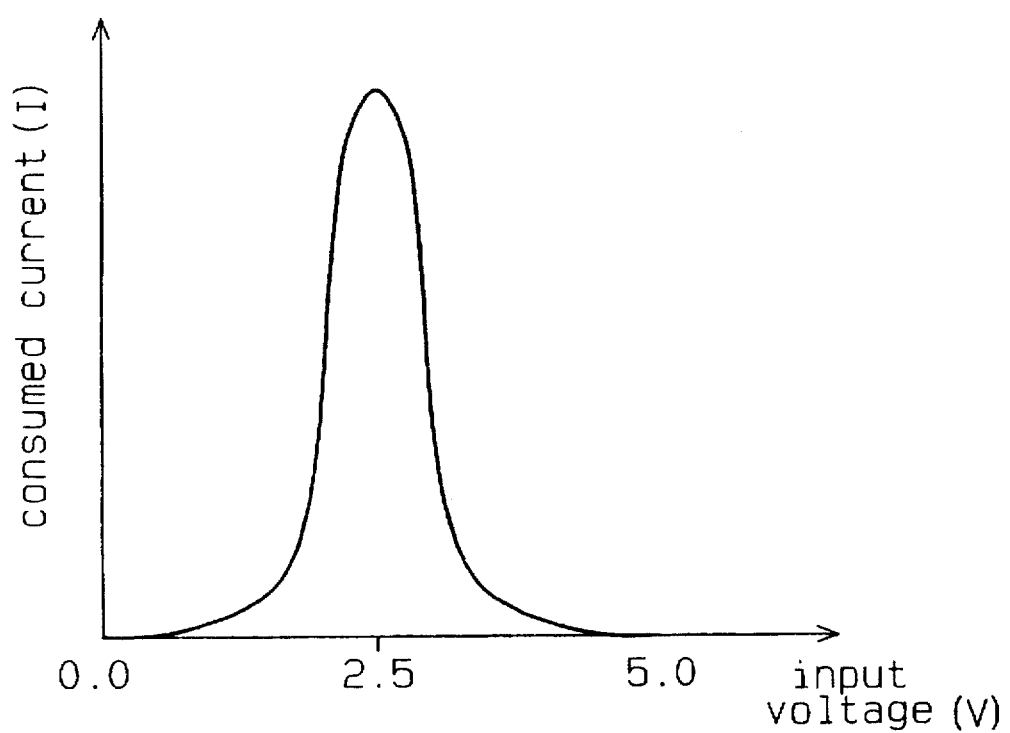
FIG. 2 is a consumed current characteristic chart illustrating the relationship between the input voltage and the consumed current of a CMOS inverter in a comparator of the A/D converter of FIG. 1.
Figure 3:
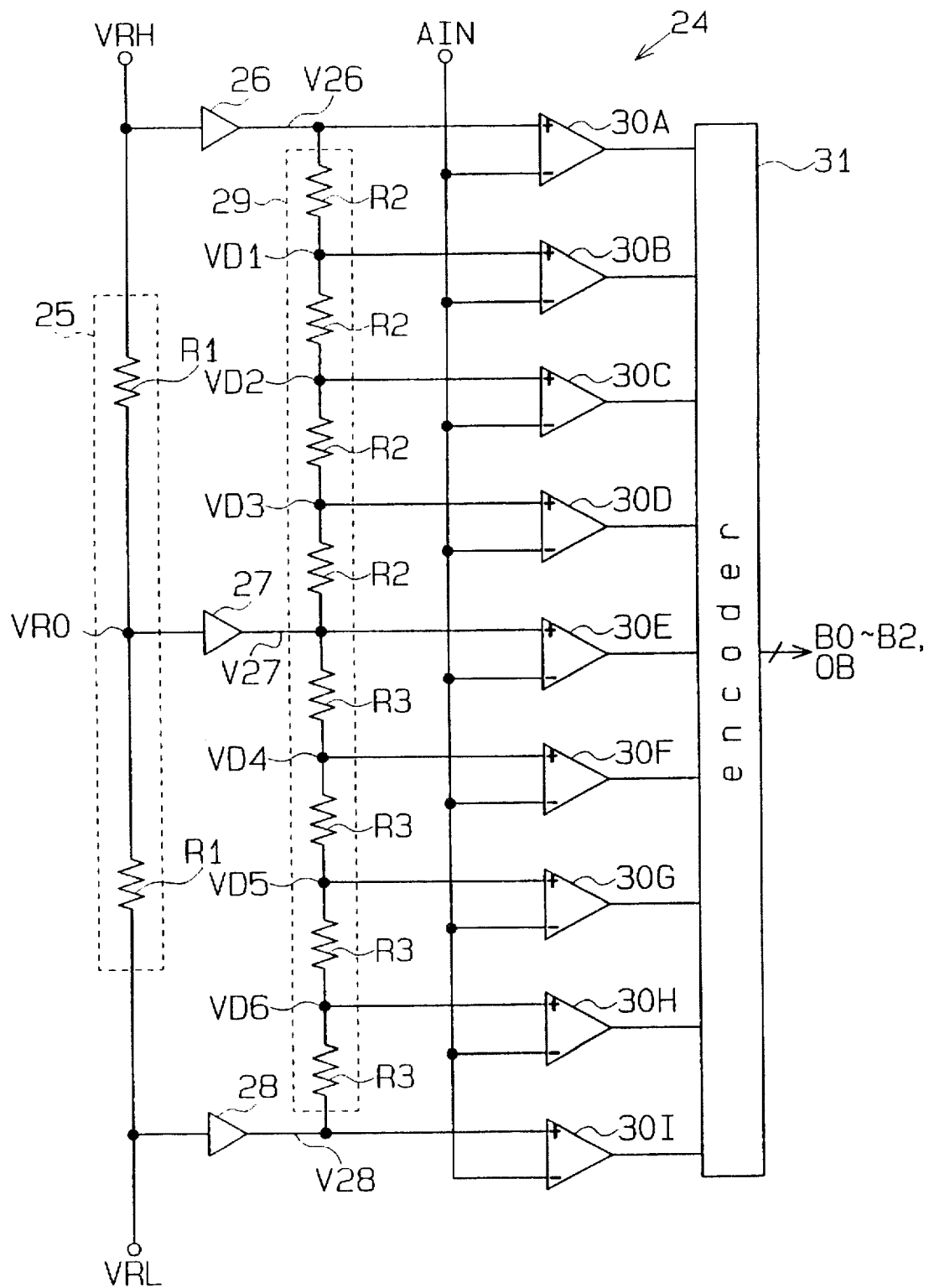
FIG. 3 is a circuit diagram showing another conventional A/D converter.
Figure 4:
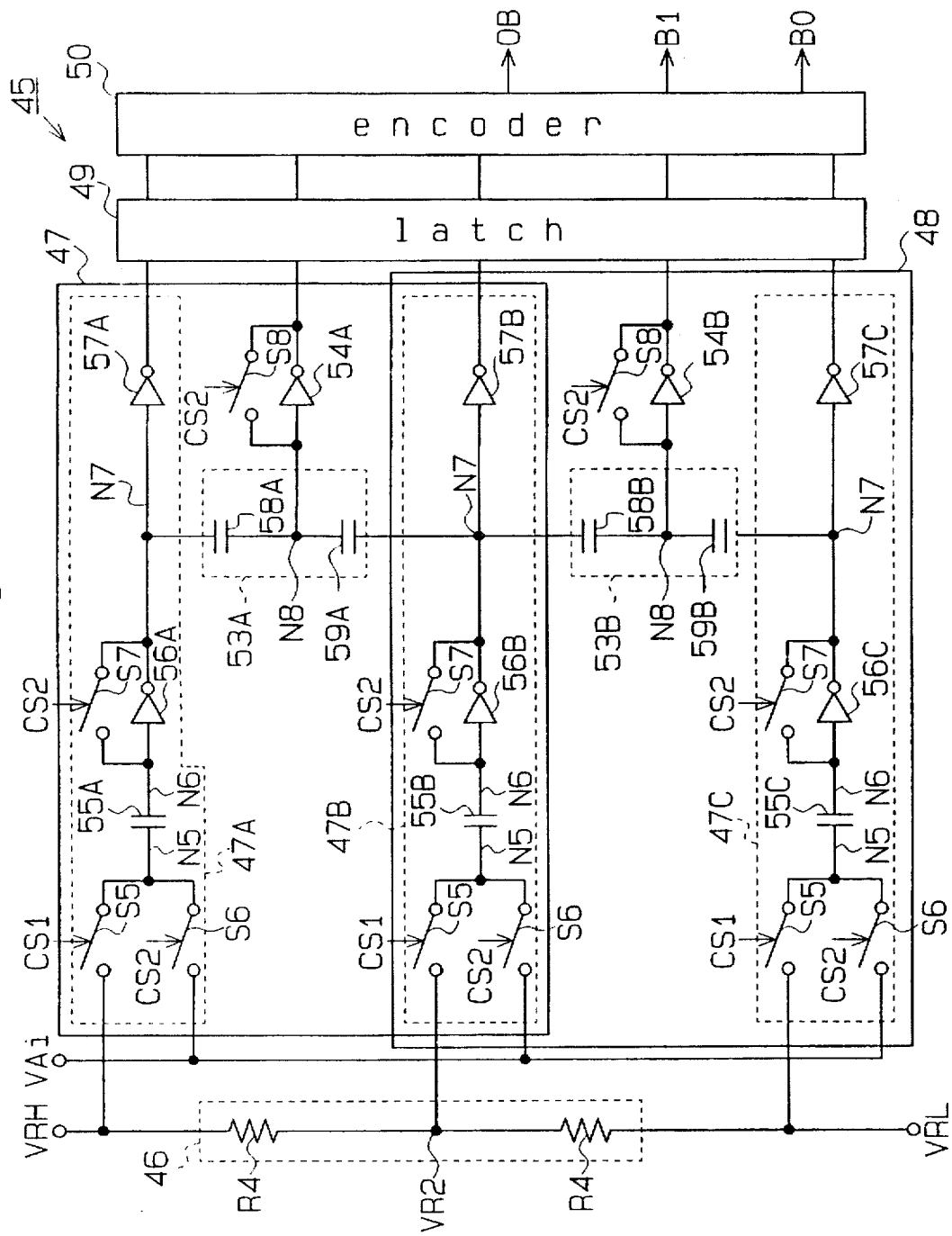
FIG. 4 is a circuit diagram showing an A/D converter according to the first embodiment of the invention.

As shown in FIG. 4, the parallel type A/D converter 45 which outputs a 2-bit digital signal has a reference voltage generator 46, a plurality of (three in this example) chopper type comparators 47A, 47B and 47C, a latch 49 and an encoder 50. The reference voltage generator 46 has two resistors R4 connected in series between a high-potential reference voltage VRH and a low-potential reference voltage VRL. The reference voltage generator 46 divides the voltage equivalent to the potential difference between the reference voltages VRH and VRL and outputs reference voltage VR2 from a node interconnecting the resistors R4.

The first to third chopper type comparators 47A, 47B and 47C have the same structure. The first and second chopper type comparators 47A and 47B constitute a first main comparator 47, and the second and third chopper type comparators 47B and 47C constitute a second main comparator 48. Therefore, the first and second main comparators 47 and 48 share the second chopper type comparator 47B. The first main comparator 47 further includes a voltage divider 53A, a CMOS inverter 54A and an analog switch S8. The second main comparator 48 further includes a voltage divider 53B, a CMOS inverter 54B and an analog switch S8.

The first chopper type comparator 47A has a first input terminal for receiving the high-potential reference voltage VRH and a second input terminal for receiving the analog input voltage VAi (where i is in the range of 1 to n). The second chopper type comparator 47B has a first input terminal for receiving the reference voltage VR2 and a second input terminal for receiving the analog input voltage VAi. The third chopper type comparator 47C has a first input terminal for receiving the low-potential reference voltage VRL and a second input terminal for receiving the analog input voltage VAi. Each of the chopper type comparators 47A, 47B or 47C has two analog switches S5 and S6, a capacitor 55A, 55B or 55C, a CMOS inverter 56A, 56B or 56C, an analog switch S7, and a CMOS inverter 57A, 57B or 57C. The CMOS inverters 56A, 56B, 56C, 57A, 57B and 57C are each powered by a high-potential supply of 5 V and a low-potential supply of 0 V.

The capacitor 55A has a first electrode (node N5) which is connected via the analog switches S5 and S6 to the first and second input terminals of the first chopper type comparator 47A and a second electrode (node N6) connected to the input terminal of the CMOS inverter 56A. The capacitor 55B has a first electrode which is connected via the analog switches S5 and S6 to the first and second input terminals of the second chopper type comparator 47B and a second electrode connected to the input terminal of the CMOS inverter 56B. The capacitor 55C has a first electrode which is connected via the analog switches S5 and S6 to the first and second input terminals of the third chopper type comparator 47C and a second electrode connected to the input terminal of the CMOS inverter 56C.

Figure 6:
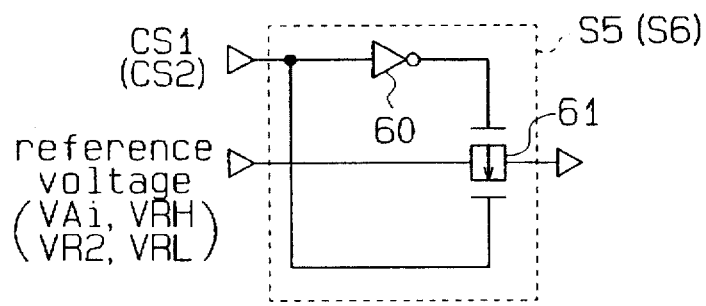
FIG. 6 is a circuit diagram showing an analog switch in a comparator of the A/D converter shown in FIG. 4.
Figure 7:
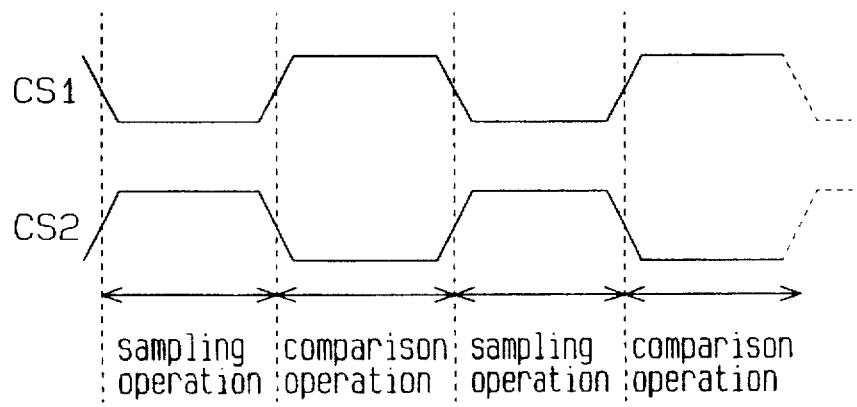
FIG. 7 is a waveform chart of control signals to be supplied to the individual analog switches in accordance with the operation timing of the A/D converter shown in FIG. 4.

As shown in FIG. 6, each of the analog switches S5 and S6 includes an inverter 60 and a transmission gate 61 which is comprised of a pMOS transistor and an nMOS transistor. Each inverter 60 has an input terminal for receiving a control signal CS1 or CS2 output from the DSP core 41 and an output terminal connected to the gate of the pMOS transistor of the transmission gate 61. The analog switch S5 is set on in response to the control signal CS1 having the H-level and the analog switches S6, S7 and S8 (S7 and S8 will be discussed later) are set on in response to the control signal CS2 having the H-level. As the individual analog switches S5, S6, S7 and S8 are set on or off in response to the H-level or L-level of control signals CS1 and CS2, the A/D converter 45 alternately repeats the sampling operation and the comparison operation as shown in FIG. 7.

Referring again to FIG. 4, the input terminal and output terminal of each CMOS inverter 56A, 56B or 56C are connected together via the analog switch S7 which has the same structure as the analog switches S5 and S6. The analog switch S7 together with the analog switch S6 is set on in response to the control signal CS2 having the H-level. When the analog switch S7 is set on, the input terminal and the output terminal of each CMOS inverter 56A, 56B or 56C are short-circuited and input and output voltages of these terminals are reset to the threshold voltage Vth. When the analog switch S7 is set off, each CMOS inverter 56A, 56B or 56C inverts and amplifies the input voltage and outputs an output voltage signal. Each of the CMOS inverters 57A, 57B and 57C inverts and amplifies output voltages of associated inverters 56A, 56B and 56C and sends the H-level or L-level first to third determination signals to the latch 49. The first determination signal indicates the result of the comparison of the high-potential reference voltage VRH with the analog input voltage VAi. The second determination signal indicates the result of the comparison of the reference voltage VR2 with the analog input voltage VAi. The third determination signal indicates the result of the comparison of the low-potential reference voltage VRL with the analog input voltage VAi.

The voltage divider 53A in the first main comparator 47 includes a plurality (two in this embodiment) of capacitors 58A and 59A connected in series between the output terminals of the CMOS inverters 56A and 56B. The voltage divider 53A divides the output voltages of both CMOS inverters 56A and 56B and supplies the divided voltage to the CMOS inverter 54A from a node NB between both capacitors 58A and 59A. The input terminal and output terminal of the CMOS inverter 54A are connected together via the analog switch S8 which has the same structure as the analog switches S5 and S6. The analog switch S8 together with the analog switch S6 is set on in response to the control signal CS2 having the H-level. When the analog switch S8 is set on, the input terminal and the output terminal of the CMOS inverter 54A are short-circuited and input and output voltages of these terminals are reset to the threshold voltage Vth. When the analog switch S8 is set off, the CMOS inverter 54A inverts and amplifies the divided voltage supplied from the node N8 and sends an H-level or L-level fourth determination signal to the latch 49. The fourth determination signal indicates the result of the comparison of a middle voltage value (intermediate voltage value), between the high-potential reference voltage VRH and the reference voltage VR2, with the analog input voltage VAi.

The voltage divider 53B in the second main comparator 48 includes a plurality (two in this embodiment) of capacitors 58B and 59B connected in series between the output terminals of the CMOS inverters 56B and 56C. The voltage divider 53B divides the output voltages of both CMOS inverters 56B and 56C and supplies the divided voltage to the CMOS inverter 54B from the node N8 between both capacitors 58B and 59B. The input terminal and output terminal of the CMOS inverter 54B are connected together via the analog switch S8 which has the same structure as the analog switches S5 and S6. The analog switch S8 together with the analog switch S6 is set on in response to the control signal CS2 having the H-level. When the analog switch S8 is set on, the input and output terminals of the CMOS inverter 54B are short-circuited and the input and output voltages of these terminals are reset to the threshold voltage Vth. When the analog switch S8 is set off, the CMOS inverter 54B inverts and amplifies the divided voltage supplied from the node N8 and sends an H-level or L-level fifth determination signal to the latch 49. The fifth determination signal indicates the result of the comparison of a middle voltage value (intermediate voltage value), between the reference voltage VR2 and the low-potential reference voltage VRL, with the analog input voltage VAi.

The latch 49 retains the first to fifth determination signals output from the first and second main comparators 47 and 48, and the encoder 50 converts first to fifth determination signals to a 2-bit digital signal B0 and B1 and an overflow bit OB.

The operation of the A/D converter 45 is discussed next. First, in the sampling operation, the analog switch S5 in each chopper type comparator 47A, 47B or 47C is set off in response to the control signal CS1 having the L-level and the analog switches S6, S7 and S8 are set on in response to the control signal CS2 having the H-level. Consequently, the voltages of the three nodes N6 and the output terminals (nodes N7) of the CMOS inverters 56A, 56B and 56C are reset to the threshold voltage Vth. Simultaneously, the charge current flows into the individual capacitors 55A, 55B and 55C, so that the voltage levels at the three nodes N5 become equal to the analog input voltage VAi. With the voltage at the node N5 taken as a reference, the voltages at the three nodes N6 become Vth–VAi. Also, the voltages of the two nodes N8 and the output terminals of the CMOS inverters 54A and 54B are reset to the threshold voltage Vth. Accordingly, the individual capacitors 58A, 58B, 59A and 59B do not perform the charging operation.

In the comparison operation, each analog switch S5 is set on in response to the control signal CS1 having the H-level, and the analog switches S6, S7 and S8 are set off in response to the control signal CS2 having the L-level. Consequently, the voltages at the three nodes N5 respectively become equal to the first to third reference voltages VRH, VR2 and VRL and the voltages at the three nodes N6 are changed respectively by the capacitors 55A, 55B and 55C. The individual CMOS inverters 56A, 56B and 56C respectively invert and amplify the voltages at those nodes N6, and respectively output the inverted and amplified voltages to the CMOS inverters 57A, 57B and 57C. The CMOS inverters 57A, 57B and 57C further invert and amplify the output voltages of the respective CMOS inverters 56A, 56B and 56C and respectively output the H-level or L-level first to third determination signals to the latch 49.

The voltage divider 53A divides the output voltages of both CMOS inverters 56A and 56B and supplies the divided voltage to the CMOS inverter 54A. The CMOS inverter 54A inverts and amplifies the output voltage of the voltage divider 53A and sends the H-level or L-level fourth determination signal to the latch 49. The voltage divider 53B divides the output voltages of both CMOS inverters 56B and 56C and supplies the divided voltage to the CMOS inverter 54B. The CMOS inverter 54B inverts and amplifies the output voltage of the voltage divider 53B and sends the H-level or L-level fifth determination signal to the latch 49. The latch 49 retains the first to fifth determination signals. The encoder 50 converts first to fifth determination signals to a 2-bit digital signal B0 and B1 and an overflow bit OB, and supplies the 2-bit digital signal and the overflow bit OB to the DSP core 41.

Figure 8:
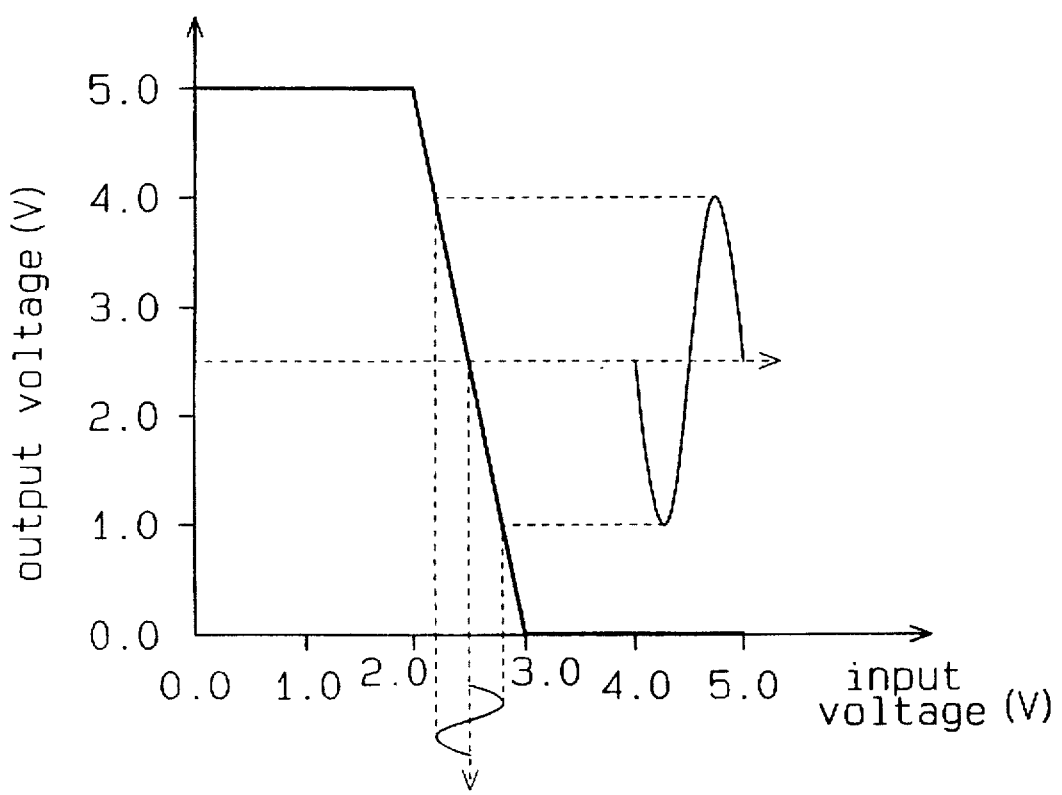
FIG. 8 is an input/output characteristic chart showing the relationship between the input voltage and the output voltage of the CMOS inverter in the comparator of the A/D converter if FIG. 4.

The comparison operation by the main comparator 47 will now be described more specifically. Suppose that a high-potential supply voltage of 5.0 V and a low-potential supply voltage of 0 V are supplied to the individual CMOS inverters 54A, 56A and 57A, and that those CMOS inverters 54A, 56A and 57A have the input/output characteristic and the threshold voltage Vth of 2.5 V as shown in FIG. 8. Also assume that the high-potential reference voltage VRH is 2.4 V, the low-potential reference voltage VRL is 1.6 V and the analog input voltage VAi is 2.3 V. Then, the reference voltage VR2 becomes 2.0 V from the high-potential reference voltage VRH of 2.4 V and the low-potential reference voltage VRL of 1.6 V.

In the sampling operation, the analog switch S5 is set off and the analog switches S6, S7 and S8 are set on. As a result, the voltage at the node N5 in the first chopper type comparator 47A becomes 2.3 V, and the voltages at the nodes N6 and N7 become 2.5 V (threshold voltage Vth). The voltage at the node N5 in the second chopper type comparator 47B becomes 2.3 V and the voltages at the nodes N6 and N7 therein become 2.5 V as well. At this time, the voltage at the node N8 become 2.5 V (threshold voltage Vth).

In the subsequent comparison operation, the analog switch S5 is set on and the analog switches S6, S7 and S8 are set off. Consequently, the voltages at the individual nodes N5, N6 and N7 in the first chopper type comparator 47A respectively become 2.4 V, 2.6 V and 2.0 V. The voltages at the individual nodes N5, N6 and N7 in the second chopper type comparator 47B respectively become 2.0 V, 2.2 V and 4.0 V. In other words, the CMOS inverters 56A and 56B operate as amplifiers. Eventually, the voltage at the node N8 becomes 3.0=(4.0+2.0)/2 V. Based on the input/output characteristic in FIG. 8, the chopper type comparator 47A (CMOS inverter 57A) outputs the H level (5.0 V) first determination signal, the chopper type comparator 47B (CMOS inverter 57B) outputs the L level (0 V) second determination signal, and the CMOS inverter 54A outputs the L-level (0 V) fourth determination signal. In other words, the individual CMOS inverters 57A, 57B and 54A operate as a comparison circuit.

According to the first embodiment, as described above, each main comparator includes a voltage divider, a CMOS inverter and an analog switch in addition to two chopper type comparators. This structure allows each main comparator to output three determination signals without using three chopper type comparators needed in the prior art. In other words, two analog switches and a single CMOS inverter in the third chopper type comparator in the prior art can be omitted. It is also possible to omit one resistor in the conventional reference voltage generator. Accordingly, the invention provides greater precision without increasing the circuit area of the comparator or increasing the consumed current from the CMOS inverters. The use of five CMOS inverters in each main comparator further leads to circuit area savings.

In the comparison operation of the main comparator 47, the inverted and amplified output voltages of the CMOS inverters 56A and 56B are a multiple of (five times in this example) the potential difference between the reference voltages VRH and VR2 which are respectively input to the first and second chopper type comparators 56A and 56B. The amplified output voltages of the CMOS inverters 56A and 56B are halved by the capacitors 58A and 59A and the halved voltages are supplied to the CMOS inverter 54A. The voltage amplification by this inverter is not susceptible to the offset voltage or noise and thus contributes to improving the determination precision.

The voltage dividers 53A and 53B comprise two series-connected capacitors 58A and 59A or 58B and 59B. This structure contributes to making the voltage divider compact. After the capacitors 58A and 59A or 58B and 59B are charged, no charge current flows into them, thus preventing an increase in consumed current.

In short, the A/D converter 45, according to the first embodiment which uses the first and second main comparators 47 and 48, can execute high-precision A/D conversion while preventing both the consumed current from increasing and the circuit area of the A/D converter 45 from increasing. Further, the DSP chip 40 equipped with the A/D converter 45 can execute high-precision A/D conversion without having to increase current consumption.

Second Embodiment

Figure 9:
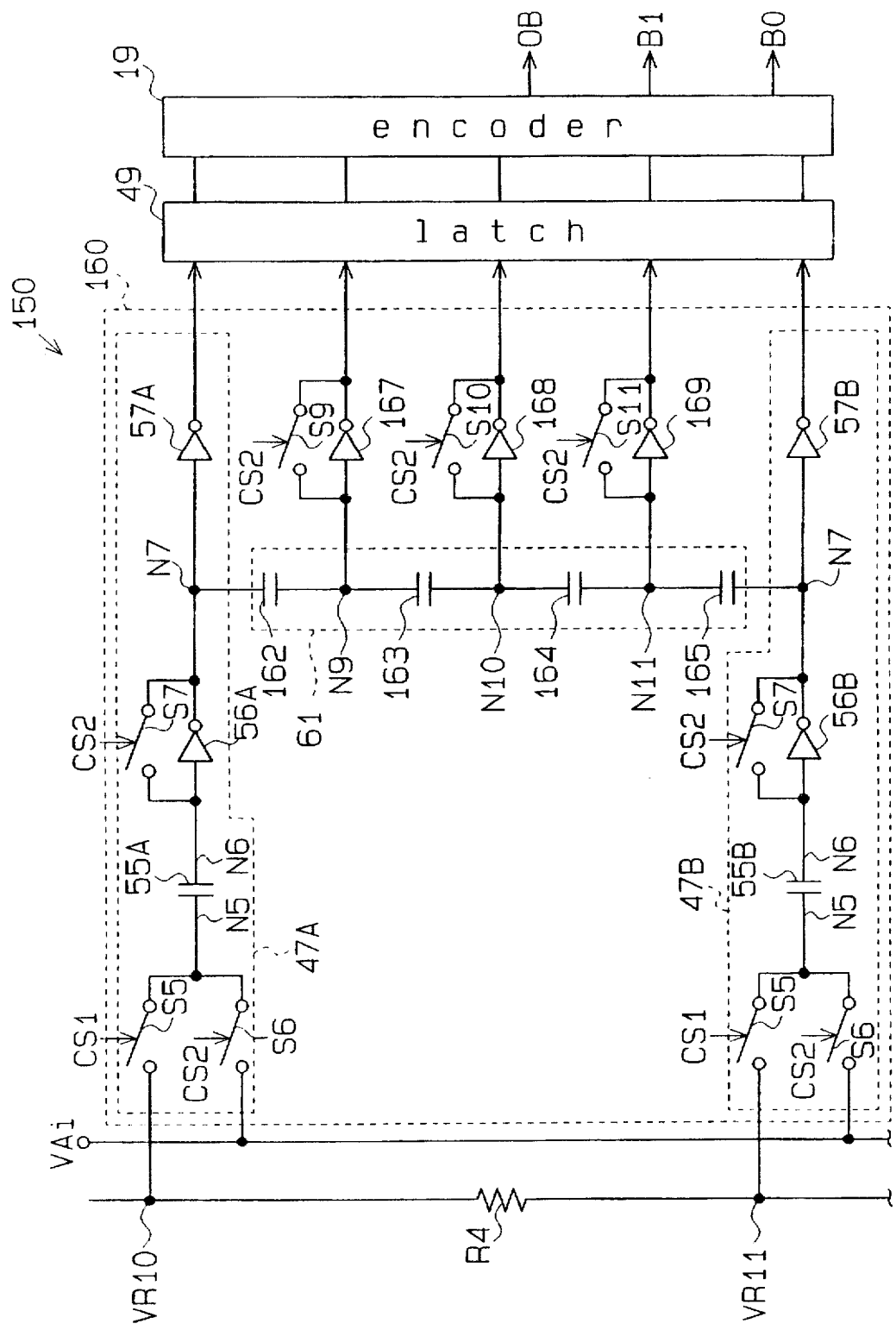
FIG. 9 is a circuit diagram illustrating a part of a comparator of an A/D converter according to the second embodiment of the invention.

The second embodiment of the present invention will be described below with reference to FIG. 9. To avoid a redundant description, like or same reference numerals are given to those components which are the same as the corresponding components of the first embodiment. An A/D converter 150 according to the second embodiment has a single main comparator 160, which includes first and second chopper type comparators 47A and 47B, a voltage divider 61, three CMOS inverters 167, 168 and 169 and three analog switches S9, S10 and S11 each having the same structure as the analog switches S5 and S6.

The voltage divider 61 includes a plurality (four in this embodiment) of capacitors 162, 163, 164 and 165 connected in series between the output terminals (nodes N7) of the CMOS inverters 56A and 56B. The voltage divider 61 divides the output voltages of both CMOS inverters 56A and 56B and supplies the three divided voltages to the CMOS inverters 167 to 169 respectively from three nodes N9 to N11 between the capacitors 162 to 165. The input terminal and output terminal of the first CMOS inverter 167 are connected together via the analog switch S9. The input terminal and output terminal of the second CMOS inverter 168 are connected together via the analog switch S10. The input terminal and output terminal of the third CMOS inverter 169 are connected together via the analog switch S11. The analog switches S9–S11 together with the analog switch S6 are set on in response to the control signal CS2 having the H-level.

When the analog switches S9–S11 are set on, the input terminal and the output terminal of each of the CMOS inverters 167–169 are short-circuited and input and output voltages of each inverter are reset to the threshold voltage Vth. When the analog switches S9–S11 are set off, the individual CMOS inverters 167–169 respectively invert and amplify the three divided voltages supplied from the voltage divider 61 and send H-level or L-level third to fifth determination signals to the latch 49. The voltage levels of the third to fifth determination signals correspond to the equally quartered voltage equivalent to the potential difference between reference voltages VR10 and VR11.

According to the second embodiment, as described above, the comparator 160 includes the voltage divider 61, the three CMOS inverters 167–169 and the analog switches S9–S11 in addition to the two chopper type comparators 47A and 47B. This structure allows each main comparator to output five determination signals without using five chopper type comparators as is needed in the prior art. In other words, six analog switches and three CMOS inverters in the three chopper type comparators corresponding to the third to fifth chopper type comparators in the prior art can be omitted. It is also possible to reduce the number of the resistors in the conventional reference voltage generator. This further prevents an increase in the circuit area of the comparator and prevents an increase in the consumed current due to the CMOS inverters. The comparator 160 of the second embodiment is not susceptible to the offset voltage or noise and thus contributes to improving the determination precision.

Although only two embodiments of the present invention have been described herein, it should be apparent to those skilled in the art that the present invention may be embodied in many other specific forms without departing from the spirit or scope of the invention. Particularly, it should be understood that the invention may be embodied in the following forms.

The invention may be adapted to a series-parallel type (half flash type) A/D converter as well as a series type A/D converter. Also, the individual CMOS inverters 56A–56C, 57A–57C, 54A, 54B and 167–169 may be replaced with differential amplifiers.

Therefore, the present examples and embodiments are to be considered as illustrative and not restrictive and the invention is not to be limited to the details given herein, but may be modified within the scope and equivalence of the appended claims.

What is claimed is:

1. A comparator for comparing an analog input voltage with a plurality of reference voltages and outputting a plurality of determination signals indicative of comparison results, said comparator comprising:

a first chopper type comparator for producing a first comparison voltage between said analog input voltage and a first reference voltage and outputting a first determination signal indicative of a comparison result based upon said first comparison voltage;

a second chopper type comparator for producing a second comparison voltage between said analog input voltage and a second reference voltage and outputting a second determination signal indicative of a comparison result based upon said second comparison voltage; and a determination circuit, connected between said first and second chopper type comparators, for producing at least one intermediate comparison voltage having a voltage level between said first comparison voltage and said second comparison voltage, and outputting at least one additional determination signal based upon said intermediate comparison voltage.

2. The comparator according to claim 1, wherein said at least one additional determination signal is indicative of a result of comparison between at least one intermediate reference voltage present between said first reference voltage and said second reference voltage with said analog input voltage.

3. The comparator according to claim 1, wherein said determination circuit includes a voltage divider, connected between said first and second chopper type comparators, for dividing said first comparison voltage and said second comparison voltage to produce said at least one intermediate comparison voltage.

4. The comparator according to claim 3, wherein said voltage divider includes two or more capacitors, connected in series between said first and second chopper type comparators, and said voltage divider outputs said at least one intermediate comparison voltage from one or more nodes between said capacitors.

5. The comparator according to claim 1, wherein said determination circuit includes a voltage divider, connected between said first and second chopper type comparators, for dividing said first comparison voltage and said second comparison voltage to produce said at least one intermediate comparison voltage, and at least one CMOS inverter, connected to said voltage divider, for outputting said at least one third determination signal.

6. A comparator for comparing an analog input voltage with a plurality of reference voltages and outputting a plurality of determination signals indicative of comparison results, said comparator comprising:

a first chopper type comparator including a first amplifier for producing a first comparison voltage between said analog input voltage and a first reference voltage and a first determination circuit for outputting a first determination signal indicative of a comparison result based upon said first comparison voltage;

a second chopper type comparator including a second amplifier for producing a second comparison voltage between said analog input voltage and a second reference voltage and a second determination circuit for outputting a second determination signal indicative of a comparison result based upon said second comparison voltage; and an intermediate determination circuit, connected between said first and second chopper type comparators, for producing at least one intermediate comparison voltage having a voltage level between said first comparison voltage from said first amplifier and said second comparison voltage from said second amplifier, and outputting at least one additional determination signal based upon said intermediate comparison voltage.

7. The comparator according to claim 6, wherein said at least one additional determination signal is indicative of a result of comparison between at least one intermediate reference voltage present between said first reference voltage and said second reference voltage with said analog input voltage.

8. The comparator according to claim 6, wherein said intermediate determination circuit includes a voltage divider, connected between said first and second chopper type comparators, for dividing said first comparison voltage from said first amplifier and said second comparison voltage from said second amplifier to produce said at least one intermediate comparison voltage.

9. The comparator according to claim 8, wherein said voltage divider includes two or more capacitors, connected in series between said first and second chopper type comparators and said voltage divider outputs said at least one intermediate comparison voltage from one or more nodes between said capacitors.

10. The comparator according to claim 9, wherein said intermediate determination circuit further includes at least one CMOS inverter, connected to said voltage divider, for outputting said at least one additional determination signal.

11. The comparator according to claim 10, wherein said CMOS inverter has an input terminal connected to said voltage divider and an output terminal for outputting said at least one additional determination signal, and wherein said intermediate determination circuit further includes a reset circuit, connected between said input terminal and output terminal of said CMOS inverter, for resetting said intermediate comparison voltage to be supplied to said input terminal and a voltage of said additional determination signal output from said output terminal to a predetermined voltage.

12. The comparator according to claim 6, wherein first and second amplifiers respectively include first and second CMOS inverters each having an input terminal and an output terminal, and wherein said first chopper type comparator further includes a first reset circuit, connected between said input terminal and output terminal of said first CMOS inverter, for resetting a voltage to be supplied to said input terminal of said first CMOS inverter and said first comparison voltage to be output from said output terminal of said first CMOS inverter to a predetermined voltage, and said second chopper type comparator further includes a second reset circuit, connected between said input terminal and output terminal of said second CMOS inverter, for resetting a voltage to be supplied to said input terminal of said second CMOS inverter and said second comparison voltage to be output from said output terminal of said second CMOS inverter to a predetermined voltage.

13. An analog/digital converter comprising:

A) a reference voltage generator for producing a plurality of reference voltages;

B) a comparator, connected to said reference voltage generator, for comparing an analog input voltage with said plurality of reference voltages and outputting a plurality of determination signals indicative of comparison results, said comparator including, B1) a first chopper type comparator for producing a first comparison voltage between said analog input voltage and a first reference voltage and outputting a first determination signal indicative of a comparison result based upon said first comparison voltage;

B2) a second chopper type comparator for producing a second comparison voltage between said analog input voltage and a second reference voltage and outputting a second determination signal indicative of a comparison result based upon said second comparison voltage, and B3) a determination circuit, connected between said first and second chopper type comparators, for producing at least one intermediate comparison voltage having a voltage level between said first comparison voltage and said second comparison voltage, and outputting at least one additional determination signal based upon said intermediate comparison voltage; and (C) an encoder, connected to said comparator, for receiving said first to third determination signals and converting said first, second and additional determination signals to digital signals.

14. The analog/digital converter according to claim 13, wherein said at least one additional determination signal is indicative of a result of comparison between at least one intermediate reference voltage present between said first reference voltage and said second reference voltage with said analog input voltage.

15. The analog/digital converter according to claim 13, wherein said analog/digital converter is incorporated in a semiconductor integrated circuit device.

16. An analog/digital converter comprising:

A) a reference voltage generator for producing a plurality of reference voltages;

B) a comparator, connected to said reference voltage generator, for comparing an analog input voltage with said plurality of reference voltages and outputting a plurality of determination signals indicative of comparison results, said comparator including, B1) a first chopper type comparator including a first amplifier for producing a first comparison voltage between said analog input voltage and a first reference voltage and a first determination circuit for outputting a first determination signal indicative of a comparison result based upon said first comparison voltage, B2) a second chopper type comparator including a second amplifier for producing a second comparison voltage between said analog input voltage and a second reference voltage and a second determination circuit for outputting a second determination signal indicative of a comparison result based upon said second comparison voltage; and B3) an intermediate determination circuit, connected between said first and second chopper type comparators, for producing at least one intermediate comparison voltage having a voltage level between said first comparison voltage from said first amplifier and said second comparison voltage from said second amplifier, and outputting at least one additional determination signal based upon said intermediate comparison voltage; and C) an encoder, connected to said comparator, for receiving said first, second and additional determination signals and converting said first, second and additional determination signals to digital signals.

17. The analog/digital converter according to claim 16, wherein said at least one additional determination signal is indicative of a result of comparison between at least one intermediate reference voltage present between said first reference voltage and said second reference voltage with said analog input voltage.

18. The analog/digital converter according to claim 16, wherein said analog/digital converter is incorporated in a semiconductor integrated circuit device.

19. A method of comparing an analog input voltage with a plurality of reference voltages and producing a plurality of determination signals indicative of comparison results, comprising the steps of:

producing a first comparison voltage between said analog input voltage and a first reference voltage using a first amplifier incorporated in a first chopper type comparator;

producing a first determination signal indicative of a comparison result based upon said first comparison voltage using a first determination circuit incorporated in said first chopper type comparator;

producing a second comparison voltage between said analog input voltage and second first reference voltage using a second amplifier incorporated in a second chopper type comparator;

producing a second determination signal indicative of a comparison result based upon said second comparison voltage using a second determination circuit incorporated in said second chopper type comparator;

producing at least one intermediate comparison voltage having a voltage level between said first and second comparison voltages using a voltage divider connected between said first and second chopper type comparators; and producing a third determination signal based upon said intermediate comparison voltage using a third determination circuit connected to said voltage divider.

20. The method according to claim 19, wherein said at least one additional determination signal is indicative of a result of comparison between at least one intermediate reference voltage present between said first reference voltage and said second reference voltage with said analog input voltage.

* * * * *